United States Patent
Chen

(10) Patent No.: US 6,924,069 B2
(45) Date of Patent: Aug. 2, 2005

(54) METHOD FOR REPAIRING ATTENUATED PHASE SHIFT MASKS

(75) Inventor: Ching-Yueh Chen, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 176 days.

(21) Appl. No.: 10/345,862

(22) Filed: Jan. 15, 2003

(65) Prior Publication Data

US 2004/0137337 A1 Jul. 15, 2004

(51) Int. Cl.[7] .............................. G01F 9/00; G03C 5/00
(52) U.S. Cl. .......................................... 430/5; 430/394
(58) Field of Search ............................. 430/5, 311, 322, 430/394; 438/735

(56) References Cited

U.S. PATENT DOCUMENTS 5,380,609 A * 1/1995 Fujita et al. .................... 430/5
5,840,445 A * 11/1998 Ikeda ............................ 430/5
6,660,653 B1 * 12/2003 Tzu et al. .................... 438/735
2003/0228047 A1 * 12/2003 Chou et al. ................. 382/144

* cited by examiner

Primary Examiner—S. Rosasco

(74) Attorney, Agent, or Firm—Tung & Associates

(57) ABSTRACT

A method for repairing an attenuated phase shift mask providing an attenuated phase shift mask comprising an etched opening and at least one underlying light attenuating layer to reveal a quartz substrate the opening including an unetched portion comprising the at least one light attenuating layer; blanket depositing a negative photoresist layer over the at least one light blocking layer to include filling at a portion of the opening; exposing the negative photoresist layer through the quartz substrate and developing the negative photoresist layer to form a negative photoresist layer portion filling a portion of the opening; and carrying out a dry etching process to remove the unetched portion.

21 Claims, 2 Drawing Sheets

METHOD FOR REPAIRING ATTENUATED PHASE SHIFT MASKS

FIELD OF THE INVENTION

This invention generally relates to methods for forming reticles and photomasks and more particularly to a method for repairing attenuated phase shift masks (PSM) caused by incomplete etching of an attenuating phase shifting layer.

BACKGROUND OF THE INVENTION

In semiconductor device manufacturing, photolithography is typically used to transfer a pattern for forming semiconductor features onto the semiconductor wafer for the formation of multi-layered structures forming integrated circuits. During a photolithographic process, radiant energy having relatively small wavelengths such as ultraviolet light is passed through a mask also referred to as a reticle to expose a radiant energy sensitive material such as photoresist formed on the wafer process surface. The mask includes predetermined circuitry patterns having regions of attenuating and non-attenuating regions where the radiant energy intensity is modulated. For example, ultraviolet (UV) light passed through the mask onto the photoresist causes chemical reactions in the exposed portion of the photoresist altering it properties. Upon development of the photoresist exposed portions are removed in the case of a positive photoresist and non-exposed portions are removed in the case of a negative photoresist.

As semiconductor device feature sizes have decreased to sizes smaller than the wavelength of light used in photolithographic processes, the diffraction of light at feature pattern edges formed on the reticle causes a loss of resolution in transferring the reticle pattern to the wafer photoresist. To increase the resolution of photolithographic pattern transfer, phase shift masks have been developed where the phase of the wavefronts of light passing through alternating portions of the reticle pattern are shifted out of phase with respect to light passing through adjacent portions to produce destructively interfering wavefronts to reduce undesired exposure of the wafer photoresist due to diffraction of light at feature edges of the reticle pattern. As a result, the contrast, and therefore transferable resolution of the reticle pattern is improved.

There have been several different types of PSM's developed to improve resolution for different types of reticle patterns. For example, in an attenuated or halftone PSM, the phase shifting function is typically accomplished by adding an extra layer of transmissive material to the mask with predetermined optical properties. Some PSM's are designed to produce improved resolution while having little improvement in depth of focus, while other PSM's are designed to have a relatively modest increase in resolution while producing a greater improvement in depth of focus. For example, attenuated PSM's also referred to as halftone PSM's are of the latter type of PSM's.

Referring to FIG. 1A, for example, in one type of attenuated PSM, a halftone film 12 is formed over a fused silica substrate 10, also referred to as a quartz substrate. For example, the halftone layer 12 may be formed to transmit a portion of the light producing an accompanying phase shift. Formed overlying the halftone layer is an opaque layer 14 which is not transmissive to light.

Referring to FIG. 1B, a photoresist layer (not shown) is formed over the chromium containing layer and exposed with an E-beam tool or light source and developed to form a circuitry pattern, for example including lines, pads, and contact holes. The chromium containing layer and the halftone layer are subsequently etched to form a clear light transmissive area, for example opening 16, revealing the quartz substrate.

Still referring to FIG. 1B, one problem according to the prior art, is that during etching of the halftone layer 12, for example by a dry etching process, etching residues including halftone layer material,e.g., 18, frequently form along the sidewalls of the opening 16 thereby reducing the size of the opening. While a portion of the quartz substrate is frequently exposed at the bottom of the opening, for example, a contact hole, the opening is defective for transferring the contact hole pattern to a process wafer in a photolithographic process. Prior art processes have attempted to repair defectively etched openings by removing the residues in a subsequent process after removing the overlying chromium containing layer. The etching residues remaining within the opening have been removed by selectively dry etching the residues e.g., 18 surrounding the opening with, for example, a selective area etching tool using a series of masking processes around individually defective contact holes using, for example, XeF gas. However, the selective etching processes of the prior art are typically very time consuming and require expensive selective etching machines to selectively etch portions of the defective reticle pattern areas. Further, time consuming masking processes are required to avoid damage to the quartz substrate during the selective etching process and frequently result in damage to the quartz substrate. Another problem with prior art processes is the risk of shifting of the contact opening in the several alignment processes required to carry out the selective etching process, resulting in deviations from a critical dimension. As a result, the critical dimension of the a repaired opening must be verified following the selective etching repair process, further adding to the cycle time for a PSM repair process.

Thus, there is a need in the semiconductor device manufacturing art for a more reliable and cost effective method for repairing etching defects in the reticle patterning process to form attenuated phase shift masks.

It is therefore an object of the invention to provide a more reliable and cost effective method for repairing etching defects in the reticle patterning process to form attenuated phase shift masks while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for repairing an attenuated phase shift mask.

In a first embodiment, the method includes providing an attenuated phase shift mask comprising an etched opening extending through a thickness of at least one light blocking layer and at least one underlying light attenuating layer to reveal a quartz substrate the opening including an unetched portion comprising the at least one light attenuating layer; blanket depositing a negative photoresist layer over the at least one light blocking layer to include filling at least a portion of the opening; exposing the negative photoresist layer through the quartz substrate and developing the negative photoresist layer to form a negative photoresist layer portion filling at least a portion of the opening; and carrying out a dry etching process to remove the unetched portion.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In a first embodiment of the invention, a light transmitting substrate, preferably quartz is provided having at least one light attenuating layer formed over the light transmitting substrate and at least one light blocking layer formed over the at least one light attenuating layer. A photolithographic patterning process is carried out to form a circuitry feature pattern followed by etching through a thickness of the at least one light blocking layer followed by etching through a thickness of the at least one light attenuating layer to form a feature opening revealing the light transmitting substrate. A negative photoresist is then applied to fill the at least a portion of the feature opening, preferably all of the feature opening, and the negative photoresist layer exposed to a light activating source through a reverse side of the light transmitting substrate. The negative photoresist is developed to leave a photoresist plug covering the exposed substrate and filling a portion of the feature opening and a second etching process is carried out to remove a remaining portion of the light attenuating layer remaining within the feature opening.

Figure 1A:
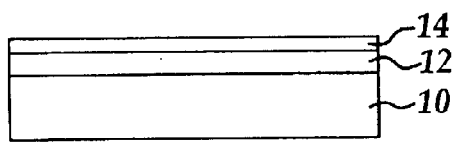
FIG. 1A is a cross sectional view of an attenuated PSM at a stage in production according to a prior art process.
Figure 1B:
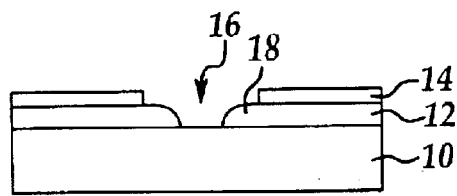
FIG. 1B is a cross sectional view of an attenuated PSM at a stage in production according to a prior art process.
Figure 2A:
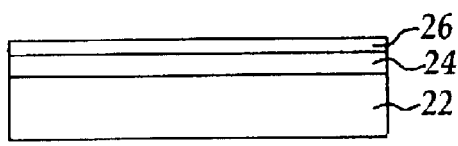
FIGS. 2A through 2E are cross sectional views of an attenuated PSM at stages in production according to an embodiment of the present invention.

In exemplary implementation, referring to FIG. 2A is shown a cross sectional side view of a portion of an attenuated phase shifting mask (PSM), for example a portion of a reticle for carrying out a photolithographic patterning process in a semiconductor wafer microelectronic circuit fabrication process. Shown is a substrate 22, for example fused silica, also referred to as quartz. Formed overlying the quartz substrate 22 is formed a light attenuating layer 24, for example formed of a material and sufficient thickness to pass from about 4% to about 40% of incident light together with a phase shift of the transmitted light of about 180 degrees. For example the light attenuating layer 24 is preferably, but not exclusively, formed of at least one layer of MoSi, $MoSi_xN_y$, and $MoSi_xO_yN_z$ having a thickness of from about 500 Angstroms to about 1500 Angstroms, depending on the optical properties of the material and the thickness required to retard the phase of transmitted light about 180 degrees. Formed overlying the light attenuating layer 24 is a light blocking layer 26 substantially opaque (non-transmitting) to incident light, for example, ultraviolet light. Preferably, the light blocking layer 26 is a chromium containing layer, for example formed of at least one layer of Cr, $CrO_xN_y$, and $CrN_x$, having a thickness less than about 1000 Angstroms.

Figure 2B:
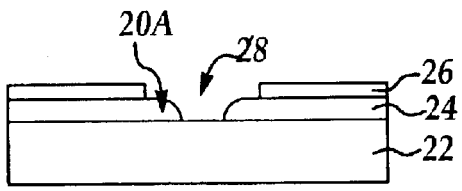

Referring to FIG. 2B, a conventional hotolithographic patterning process is used to pattern a photoresist layer (not shown) formed over the light blocking layer 26, for example using an E-beam or light exposure process followed by a development process to form an etching pattern for etching feature openings. For example a first etching process is carried out to etch through a thickness of the light blocking layer 26, for example using a wet or more preferably, a dry etching process. For example a dry etching chemistry for etching through a chromium containing light blocking layer preferably includes a chlorine and oxygen containing etching chemistry. Following etching through a thickness of the light blocking layer 26, the photoresist layer (not shown) is removed by a wet or dry etching process, preferably a dry etching process; and a second etching process, preferably a dry etching process, for example using a dry etching chemistry including $SF_6$ for a MoSiON containing layer. The second dry etching process is carried out to etch through a thickness of the light attenuating layer 24 to form opening 28 extending through the light blocking layer 26 and through the light attenuating layer 24 to reveal the quartz substrate 22.

Figure 2C:
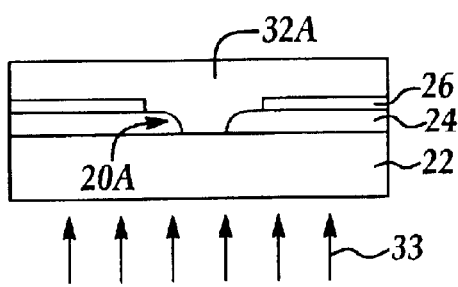

According to the present invention, it has been found that the second dry etching process to etch the light attenuating layer, especially where a fluorine containing etching chemistry is used to etch molybdenum and silicon containing materials, for example MoSiON, results in dry etching residues along the light attenuating layer portion of the opening 28 sidewalls e.g., 20A. Referring to FIG. 2C, according to an embodiment of the present invention, following the second dry etching process to form opening 28, a negative photoresist layer 32A is blanket deposited, for example by spin coating the negative photoresist over the light blocking layer to include filling the opening 28.

Preferably, the negative photoresist is activated by I-line light sources, but negative photoresists activated by DUV light sources may also be suitably used.

Still referring to FIG. 2C, the negative photoresist layer 32A is exposed to a light activating source through the quartz substrate, that is, the exposing light source is incident on the side opposite the quartz substrate having the light attenuating layer as indicated by directional arrows e.g., 33 indicating the direction of the exposing light. In operation, the etching residues along the opening 28 sidewalls e.g., 20A attenuate the light to an extent that the negative photoresist layer portions adjacent and overlying the light attenuating layer portions are not adequately exposed to the activating light thereby rendering the non-exposed portions (i.e., not sufficiently exposed) of the negative photoresist soluble in a negative photoresist developer. Simultaneously, the exposed portion of the negative photoresist layer 32A, forming a plug in the opening 28 extending above the revealed portion of the quartz substrate, is exposed to the activating light source rendering that portion insoluble in the negative photoresist developer.

Figure 2D:
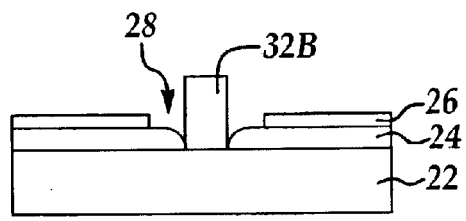

Referring to FIG. 2D, following photoresist development of photoresist layer 32A according to conventional processes, negative photoresist plug portion 32B is formed over the exposed portion of the quarts substrate. In the case sidewall residues are not present within an opening, for example other openings forming part of the circuitry pattern where such other openings have already been adequately etched as shown in FIG. 2E, the negative photoresist portion will fill the opening thereby protecting the quartz substrate during a subsequent etching process.

Figure 2E:
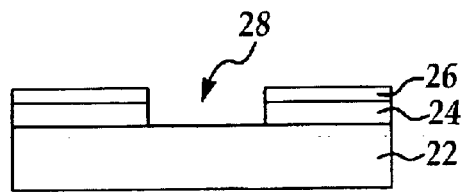

Referring to FIG. 2E, following exposure and development of the negative photoresist layer 32A to form negative photoresist layer portion (plug) 32B, a third etching process, preferably a dry etching process, for example using a dry etching chemistry, preferably including a fluorine containing etching chemistry, including for example, $SF_6$ and XeF, is carried out to etch away remaining portions of the attenuating blocking layer 24 within opening 28, for example residues remaining from the second dry etching process, such as MoSiON containing etching residues remaining along opening sidewalls e.g., 20A. Following the third etching process, the remaining negative photoresist layer portion 32B is removed according to a conventional wet or dry etching process to leave a cleared opening 28. During the third etching process, the quartz substrate is advantageously protected from etching damage by the negative photoresist plug portion 32B. Furthermore, the light blocking layer 26 acts a hard etching mask during the third etching process, thereby retaining the critical dimensions of the opening 28. In other words, the third etching process is preferably selective to the light attenuating layer with respect to the light blocking layer and the negative photoresist plug portion 32B. Conventional processes are subsequently carried out to complete the formation of the attenuated PSM, for example removing all or a portion of the light blocking layer.

Figure 3:
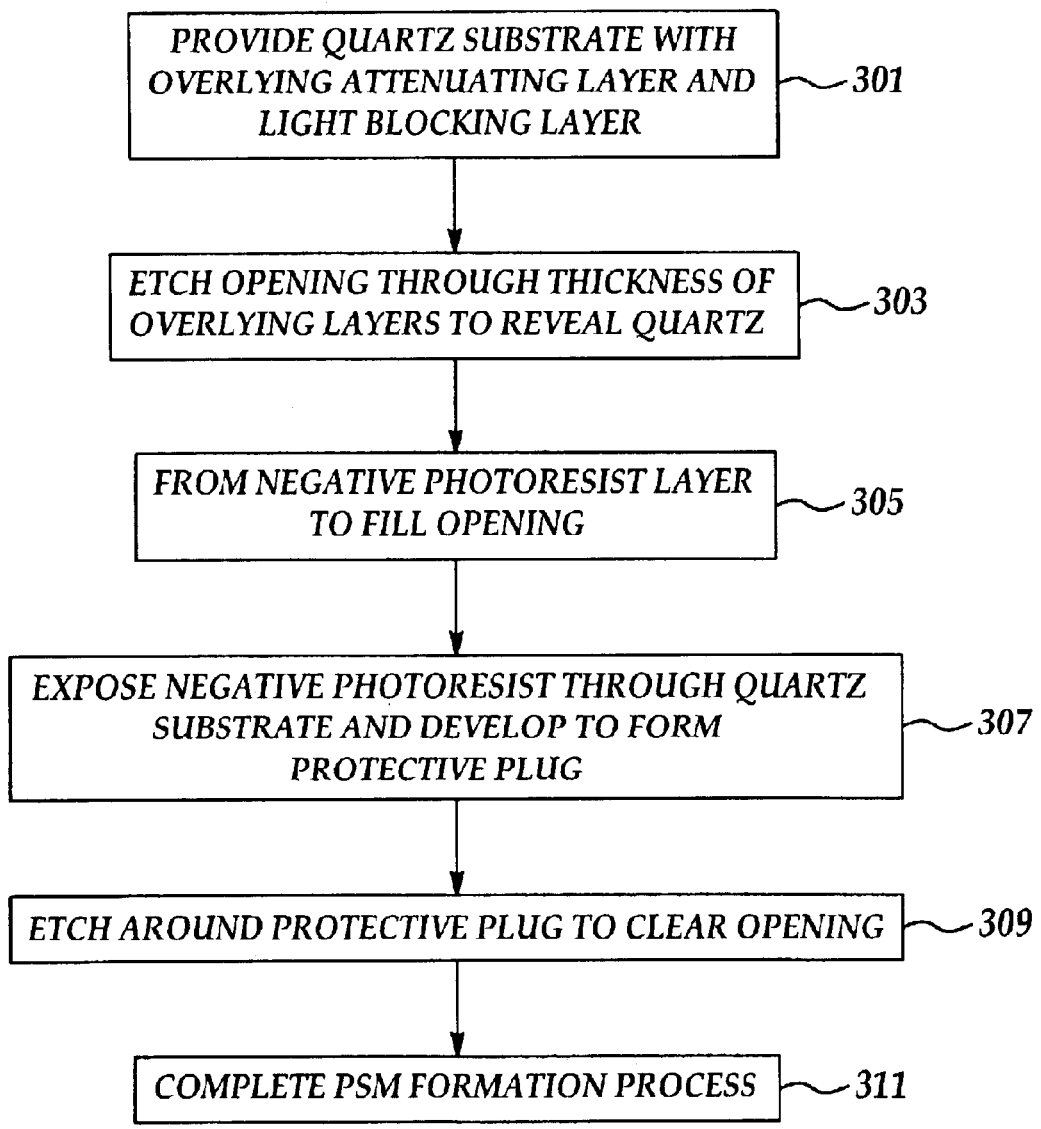
FIG. 3 is a process flow diagram including several embodiments of the present invention.

Referring to FIG. 3 is a process flow diagram including several embodiments of the present invention. In process 301, a quartz substrate having a first light attenuating layer and a second light blocking layer overlying the first attenuating layer is provided. In process 303, an photolithographic patterning and first etching process is carried out etch through a thickness of the light blocking layer followed by a second etching process to etch through a thickness of the light attenuating layer to form an opening revealing the quartz substrate. In process 305, a negative photoresist layer is blanket deposited over the light blocking layer to include filling at least a portion of the opening. In process 307, the negative photoresist layer is exposed through the reverse side of the quartz substrate and developed to form a negative photoresist protective plug filling at least a portion of the opening. In process 309, a third etching process is carried out to remove a remaining portion of the light attenuating layer remaining within the opening to clear the opening followed by removal of the remaining negative photoresist plug. In process 311, the attenuated PSM formation process is completed.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an attenuated phase shift mask comprising the steps of:
    providing an attenuated phase shift mask comprising an etched opening extending through a thickness of at least one light blocking layer and at least one underlying light attenuating layer to reveal a light transmitting substrate;
    forming a negative photoresist layer over the at least one light blocking layer to include filling at least a portion of the opening;
    then exposing the negative photoresist layer to activating light through the light transmitting substrate;
    developing the negative photoresist layer to form a negative photoresist layer portion filling at least a portion of the opening; and,
    then carrying out a dry etching process comprising further etching the opening.

2. The method of claim 1, wherein the at least one light attenuating layer comprises a layer selected from the group consisting of MoSi, MoSiN, and MoSiON.

3. The method of claim 1, wherein the at least one light attenuating layer passes from about 4% to about 40% of incident light to produce a phase shift of about 180 degrees with respect to a transmitted light portion.

4. The method of claim 1, wherein the at least one light blocking layer comprises chromium.

5. The method of claim 1, wherein the step of exposing comprises a light activating source selected from the group of an I-line light source and a deep ultraviolet (DUV) light source.

6. The method of claim 1, wherein the dry etching process comprises at least one of fluorine and chlorine.

7. The method of claim 6, wherein the dry etching process comprises supplying XeF gas.

8. The method of claim 1, wherein the opening comprises a portion of a circuitry pattern including a phase shifting portion.

9. A method for forming an attenuated phase shift mask comprising the steps of:
    providing a light transmitting substrate having at least one overlying light attenuating layer and at least one light blocking layer overlying the light attenuating layer;
    photolithographically patterning and etching according to a first etching process to form an opening extending through a thickness of the at least one light blocking layer and the at least one light attenuating layer to expose the light transmitting substrate;
    forming a negative photoresist layer over the at least one light blocking layer to include filling at least a portion of the opening;
    exposing the negative photoresist layer to activating light through a reverse side of the light transmitting substrate and developing the negative photoresist layer to form a negative photoresist plug filling at least a portion of the opening; and,
    carrying out a second etching process to remove sidewall etching residues remaining within the opening.

10. The method of claim 9, wherein the light transmitting substrate comprises fused silica.

11. The method of claim 9, wherein the at least one light attenuating layer comprises a layer selected from the group consisting of MoSi, MoSiN, and MoSiON.

12. The method of claim 9, wherein the at least one light attenuating layer passes from about 4% to about 40% of incident light.

13. The method of claim 9, wherein the at least one light attenuating layer is formed to produce a phase shift of about 180 degrees with respect to a transmitted light portion.

14. The method of claim 9, wherein the at least one light blocking layer comprises chromium.

15. The method of claim 9, wherein the first etching process comprises a dry etching process for etching through a thickness of the light attenuating layer.

16. The method of claim 15, wherein the dry etching process comprises at least one of fluorine and chlorine.

17. The method of claim 9, wherein the light attenuating layer comprises MoSiON.

18. The method of claim 9, wherein the opening is a contact hole forming a portion of a circuitry pattern.

19. The method of claim 9, wherein the step of exposing comprises a light activating source selected from the group of an I-line light source and a deep ultraviolet (DUV) light source.

20. The method of claim 9, wherein the second etching process comprises a dry etching process.

21. A method for forming an attenuated phase shift mask comprising the steps of:
- providing an opening extending through a light blocking layer and an underlying phase shifting layer, the light blocking layer and phase shifting layer overlying a light transmitting substrate;
- forming a resist layer over the light blocking layer to fill the opening;
- exposing the resist layer to activating light through the light transmitting substrate;
- developing the resist layer to from a resist plug at least partially filling the opening; and,
- etching the opening using the resist plug as an etching mask.

* * * * *